US009774363B1

(12) United States Patent
Tertinek

(10) Patent No.: US 9,774,363 B1
(45) Date of Patent: Sep. 26, 2017

(54) GAIN CALIBRATION FOR DIGITALLY CONTROLLED OSCILLATOR IN FAST LOCKING PHASE LOCKED LOOPS

(71) Applicant: Intel IP Corporation, Santa Clara, CA (US)

(72) Inventor: Stefan Tertinek, Linz (AT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/200,910

(22) Filed: Jul. 1, 2016

(51) Int. Cl.
*H04B 7/00* (2006.01)
*H04B 1/40* (2015.01)
*H04L 27/152* (2006.01)
*H04B 1/16* (2006.01)

(52) U.S. Cl.
CPC ............ *H04B 1/40* (2013.01); *H04L 27/152* (2013.01)

(58) Field of Classification Search
CPC ........ H04L 7/033; H03L 7/0891; H03L 7/093
USPC ................................. 455/260, 265; 375/376
See application file for complete search history.

(56) References Cited

U.S. PATENT DOCUMENTS

2006/0226916 A1* 10/2006 Florescu .............. H03L 7/0898 331/16
2016/0099720 A1* 4/2016 Bashir ................. H03B 5/1215 331/8

OTHER PUBLICATIONS

Staszewski et al., "Transactions Brief", "Just-In-Time Gain Estimation of an RF Digitally-Controlled Oscillator for Digital Direct Frequency Modulation", IEEE Transactions on Circuits and Systems-II: Analog and Digital Signal Processing, vol. 50, No. 11, Nov. 2003, pp. 887-892, Texas Instruments, Dallas, TX, USA.

* cited by examiner

*Primary Examiner* — Lee Nguyen
(74) *Attorney, Agent, or Firm* — Lowenstein Sandler LLP

(57) ABSTRACT

An apparatus of a mobile device may calibrate RF circuitry for mobile communications. The apparatus may include phase locked loop (PLL) comprising a digital controlled oscillator (DCO) and one or more processors coupled to the PLL. The one or more processors may determine a coarse tuning setting for the DCO based on a target frequency of a wireless channel; and calculate, a DCO gain value for the coarse tuning setting based on a calibration DCO gain value for a calibration coarse tuning setting.

21 Claims, 9 Drawing Sheets

100

110

Front End Circuitry 108

RF Circuitry 106

Baseband Circuitry 104

Application Circuitry 102

900A

900B

GAIN CALIBRATION FOR DIGITALLY CONTROLLED OSCILLATOR IN FAST LOCKING PHASE LOCKED LOOPS

BACKGROUND

The disclosure relates to the field of wireless communications, including locking of phase locked loops during wireless communications.

BRIEF DESCRIPTION OF THE DRAWINGS

Various implementations of the present disclosure will be understood more fully from the detailed description given below and from the accompanying drawings of various implementations of the invention.

DETAILED DESCRIPTION

Figure 1:
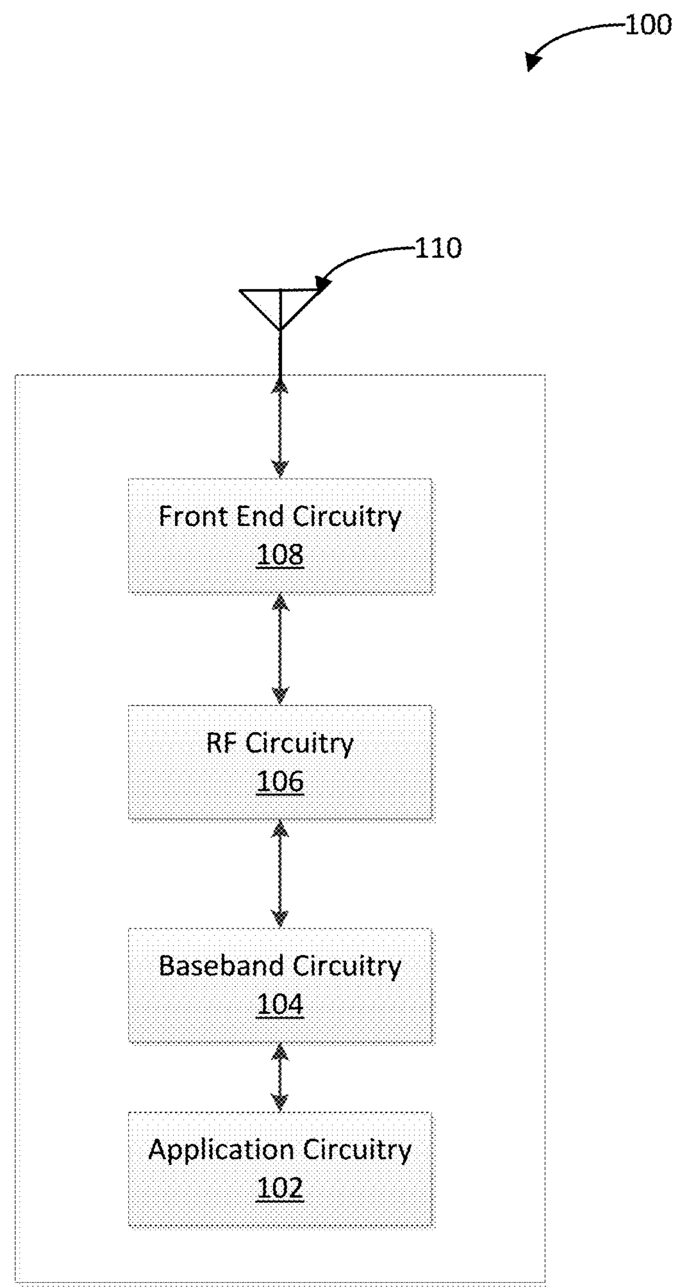
FIG. 1 is a block diagram illustrating components of an electronic device implementing aspects of the disclosure, according to an implementation.

In order to perform wireless communications with a network, a mobile device may use a phase-locked loop to match a target frequency. This may ensure that the frequency of the communication channel is kept consistent to improve the quality of signals received and transmitted by the mobile device. The target frequency may be set based on a channel that the mobile device is to use. For example, the channel may be determined based on signaling from a base station indicating a channel over which the mobile device is to transmit or receive signals. In order to meet timing restrictions for communications over a wireless network, the mobile device may have restrictions on the amount of time it takes to lock a phase locked loop. In order to reduce the time required by a mobile device to lock a phase locked loop onto a signal, the mobile device may perform measurement and calibration operations in firmware prior to the process of locking a phase locked loop onto a reference signal.

A phase locked loop (PLL) used in a mobile device may be a digital phase locked loop. The digital phase locked loop may include a digital controlled oscillator (DCO) that can increase or decrease the frequency of an output signal based on a received input. In some implementations, the received input may be a digital signal that indicates one or more capacitors to activate in one or more capacitor banks. For example, the DCO may include a coarse tuning (CT) capacitor bank and a fine tuning (FT) capacitor bank. The coarse tuning capacitor bank may be set by a signal to a set of frequencies that each covers a frequency range of approximately 1-2 GHz. In order to lock onto frequencies between the set frequencies of the CT capacitor bank, the PLL may include the FT capacitor bank. The FT capacitor bank may include a set of capacitors that are smaller than the CT capacitors that can tune to frequencies with a higher degree of accuracy. For example, in some implementations, the FT capacitors in the FT capacitor bank may be on the order of magnitude of 100-500 aF. In some implementations, the capacitors may have different values. To set the DCO to a particular frequency, the PLL may provide a signal setting a CT setting for the CT capacitor bank and a FT setting for the FT capacitor bank. In some implementations, fewer or additional sets of capacitor banks may be used to fine tune the frequency of a DCO.

In some implementations, the DCO may use the CT capacitor bank for open loop tuning to a frequency. For example, a CT setting may be set based on a target frequency for the PLL to lock onto. The FT capacitor bank may be used for closed loop tuning of the DCO frequency. For example, after selecting a CT setting, the FT setting may be continuously updated to lock onto the reference signal during PLL locking. The frequency change between settings of the FT capacitor bank, therefore, must be known by the PLL in order to lock onto the reference signal with the DCO. The change in frequency per change in FT setting may be referred to as DCO gain. The DCO gain may be described as $K_{DCO}=\Delta f_{DCO}/\Delta FT$, wherein $\Delta f_{DCO}$ is the change in the frequency of the DCO and $\Delta FT$ is the change in the FT setting.

Figure 7:
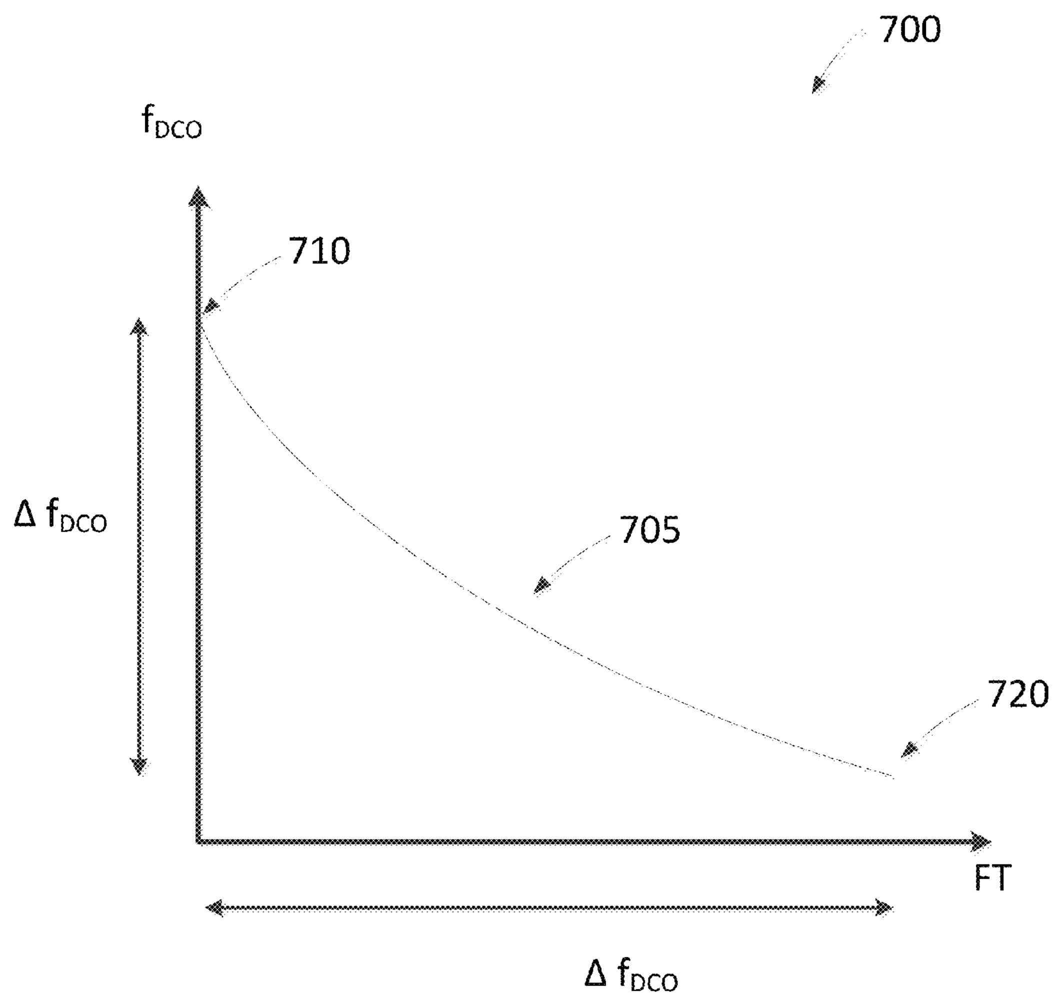
FIG. 7 is a graph illustrating the relationship of values of settings of capacitors to frequency output by an oscillator, according to an implementation.

FIG. 7 is a graph 700 showing the relationship to FT settings on the horizontal axis and the frequency output of a DCO on the vertical axis. The line 705 represents the frequency output at particular FT settings. In order to estimate the gain, for the range shown in the graph, a processor may use the change in the frequency ($\Delta f_{DCO}$) and the change in the FT setting ($\Delta FT$) between two points of the graph. For example, the processor may use the differences between the values of points 710 and 720 on the graph to calculate a value for the DCO gain. The graph shown in FIG. 7 may show the frequencies available based on FT settings for a particular CT setting. In order to provide a well-defined and stable closed loop behavior, the gain $K_{DCO}$ may be calibrated to improve the accuracy of the DCO gain.

The gain may change based on the properties of the chip performing PLL. For example, process and temperature variation may affect the gain. Another factor that changes the value of gain is the CT setting. For example, a CT setting that operates the DCO at a lower frequency may produce a different gain than a CT setting that operates the DCO at a higher frequency. In order to generate an accurate DCO gain at different CT settings, the PLL may calibrate the DCO gain each time the PLL is locked to a different channel. For example, the DCO gain may be calculated when locking to a channel by measuring the DCO frequency at two FT settings to determine the change in frequency per change in FT setting. In some implementations, the DCO gain may be calculated using a minimum and maximum FT setting.

In some implementations, rather than measuring and calculating a DCO gain when the PLL locks to a new channel, the DCO gain may be calibrated using firmware calculations based on the CT setting. In some implementations, the mobile device may characterize a CT curve for the CT capacitor bank during boot calibration for the PLL. For example, the CT characterization may be performed when the chip that has the PLL is powered up. The CT curve may be used to determine a CT setting for the PLL to use based on a target frequency of a channel. When the PLL is to lock onto a target frequency to receive signals over a channel a CT setting may be selected and the mobile device may perform a DCO gain calibration for the selected CT setting. The calculated DCO gain may then be used to set the FT capacitor bank during PLL locking.

In some implementations the DCO gain may be calculated using firmware operations to determine the effect of the frequency of a CT setting on the DCO gain of the FT capacitor bank. An example of equations that may be implemented in firmware to calculate DCO gain is described herein; however, in some other implementations, other equations or implementations may be used. For example, the equations below use a firmware implementation of a first order Taylor series expansion to estimate values for DCO gain. In some implementations, the firmware may instead use a higher order Taylor series expansion or another analytical process to calculate an estimated DCO gain. However, the processes performed by the system may be similar when using different analytical implementations. The firmware may calculate the DCO gain for a setting CT=n based on a previously measured DCO gain for setting CT=K. For example, the DCO gain for CT=K may be calculated based on the measured change in frequency between two FT settings while the CT setting is set to K. In some implementations, when the setting FT=0, the FT capacitor does not change the frequency generated by the DCO. Accordingly, the frequency with a setting CT=n and FT=0 is determined based on the capacitance of the CT capacitor bank and the inductance of the DCO. If the inductance of the DCO is a constant value L, then the frequency output by the DCO is given by equation (1).

$$f_{DCO}(C_n) = \frac{1}{2\pi\sqrt{LC_n}} \tag{1}$$

In equation 1, $C_n$ is the capacitance of the CT bank when the CT setting is "n." When the FT setting is changed from FT=0 to FT=max, the capacitance of the DCO will change by a value ΔC. The new capacitance changes the frequency output by the DCO. The new frequency output by the DCO may be calculated by equation (2).

$$f_{DCO}(C_n + \Delta C) = \frac{1}{2\pi\sqrt{L(C_n + \Delta C)}} \tag{2}$$

The values $f_{DCO}(C_n)$ and $f_{DCO}(C_n+\Delta C)$ give the DCO frequency at two FT settings for a given CT setting "n" ($CT_n$). In order to determine a DCO gain for a setting $CT_n$ based on measurement of DCO gain of setting $CT_K$, the mobile device may use equations (1) and (2) to calculate $K_{DCO}(CT_n)=\Delta f_{DCO}(CT_n)/\Delta FT=(f_{DCO}(C_n+\Delta C)-f_{DCO}(C_n))/\Delta FT$ using the measured relationship for $K_{DCO}(CT_K)=\Delta f_{DCO}(CT_K)/\Delta FT$. Applying a first order Taylor series expansion of these equations, produces equation (3) which may be used to estimate the DCO gain of the setting $CT_n$.

$$K_{DCO}(CT_n) = \left(\frac{f_{DCO}(CT_n)}{f_{DCO}(CT_K)}\right)^3 K_{DCO}(CT_K) \tag{3}$$

Equation (3) provides the DCO gain for CT=n based on a measured DCO gain for CT=K and the frequencies of CT settings n and K, which may be determined based on the CT characterization curve. This equation indicates that the measured DCO gain for one CT settings can be scaled to another DCO gain for another CT setting using the ratio of the frequencies of the two CT settings to the third power.

In order to perform the firmware operations to calculate the DCO gain at a CT setting, the mobile device may use measurements generated during boot calibration of the PLL chip and calculations according to equation (3). Thus, in some implementations, the values of $f_{DCO}(CT_K)$ and $K_{DCO}(CT_K)$ may be measured during power on of the PLL chip. For example, the frequency $f_{DCO}(CT_K)$ may be measured using a counter operatively coupled to the output of the PLL. The value for $K_{DCO}(CT_K)$ may be calculated based on measured frequencies for different FT settings as discussed above. The mobile device may also characterize the CT curve of the PLL during boot calibration.

Based on the measured values for $f_{DCO}(CT_K)$ and $K_{DCO}(CT_K)$, the mobile device may calculate the DCO gain in firmware prior to locking onto a channel. The mobile device may determine a CT setting for the target frequency of the selected channel based on a CT characterization. The mobile device may then calculate the DCO gain for the selected CT setting based on firmware implementing equation (3). The DCO gain may then be used to set the output frequency of the DCO to an initial setting prior to PLL locking, and may be used to lock the DCO output to a reference signal during PLL locking. In some embodiments, the DCO gain calculated using a firmware based approach may provide accuracies within ±6%. In some implementation the DCO gain calculation may provide higher or lower accuracies depending on the implementation hardware or firmware.

In some implementations, the mobile device may compensate for temperature-dependent gain variation based on measuring a temperature value during boot calibration and taking a second temperature measurement before locking. The temperature-dependent gain variation can be corrected for at the calculated DCO gain. The correction value for the temperature-dependent gain variation may be based on a set of characterization values stored at the mobile device that are determined during testing in manufacture or during operation.

Using firmware to calculate the DCO gain for a PLL may shorten the time required to lock during PLL locking. For example, the DCO gain may be calculated faster using firmware than using hardware measurements. In addition, the DCO gain may be calculated in firmware before PLL locking, for example during a prep macro for a configured radio access technology (e.g. LTE prep macro, 3G prep macro, or the like), and thus may not add any time to PLL locking. In addition to speeding up processes, the shortened time may provide additional computing time to receiver processors to perform other operations unrelated to the PLL locking procedures.

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of the claimed disclosure. However, various aspects of the disclosed implementations may be practiced in other examples that depart from these specific details. In certain instances, descriptions of well-known devices, circuits, and methods are omitted so as not to obscure the description of the present disclosure with unnecessary detail.

As used herein, the term "circuitry" may refer to, be part of, or include an Application Specific Integrated Circuit (ASIC), an electronic circuit, a processors (shared, dedicated, or group), and/or memory device (shared, dedicated, or group) that execute one or more software or firmware programs, a combinational logic circuit, and/or other suitable hardware components that provide the described functionality. In some implementations, the circuitry may be implemented in, or functions associated with the circuitry may be implemented by, one or more software or firmware modules. In some implementations, circuitry may include logic, at least partially operable in hardware.

Implementations described herein may be implemented into a system using any suitably configured hardware and/or software. FIG. 1 illustrates, for one implementation, a block diagram of example components of a mobile device 100. In some implementations, the mobile device 100 may include application circuitry 102, baseband circuitry 104, Radio Frequency (RF) circuitry 106, front-end circuitry 108, and one or more antennas 110, coupled together at least as shown.

In the mobile device 100, the application circuitry 102 may include one or more application processors. For example, the application circuitry 102 may include circuitry such as, but not limited to, one or more single-core or multi-core processors. The processor(s) may include any combination of general-purpose processors and dedicated processors (e.g., graphics processors, application processors, etc.). The processors may be coupled with and/or may include memory/storage and may be configured to execute instructions stored in the memory/storage to enable various applications and/or operating systems to run on the system.

The baseband circuitry 104 may include circuitry such as, but not limited to, one or more single-core or multi-core processors. The baseband circuitry 104 may include one or more baseband processors and/or control logic to process baseband signals received from a receive signal path of the RF circuitry 106 and to generate baseband signals for a transmit signal path of the RF circuitry 106. Baseband processing circuitry 104 may interface with the application circuitry 102 for generation and processing of the baseband signals and for controlling operations of the RF circuitry 106. For example, in some implementations, the baseband circuitry 104 may include a second generation (2G) baseband processor, a third generation (3G) baseband processor, a fourth generation (4G) baseband processor, and/or other baseband processor(s) for other existing generations, generations in development, or to be developed in the future (e.g., fifth generation (5G), 6G, or the like). The baseband circuitry 104 may handle various radio control functions that enable communication with one or more radio networks via the RF circuitry 106. The radio control functions may include, but are not limited to, signal modulation/demodulation, encoding/decoding, radio frequency shifting, etc. In some implementations, the baseband circuitry 104 may determine a channel or frequency for uplink or downlink communications based on messages received from the network. The baseband circuitry 104 may instruct the RF circuitry 106 to monitor particular channels or frequencies as well as to transmit on particular channels or frequencies.

In some implementations, modulation/demodulation circuitry of the baseband circuitry 104 may include Fast-Fourier Transform (FFT), preceding, and/or constellation mapping/demapping functionality. In some implementations, encoding/decoding circuitry of the baseband circuitry 104 may include convolution, tail-biting convolution, turbo, Viterbi, and/or Low Density Parity Check (LDPC) encoder/decoder functionality. Implementations of modulation/demodulation and encoder/decoder functionality are not limited to these examples and may include other suitable functionality in other implementations.

In some implementations, the baseband circuitry 104 may include elements of a protocol stack such as, for example, elements of an evolved universal terrestrial radio access network (EUTRAN) protocol including, for example, physical (PHY), media access control (MAC), radio link control (RLC), packet data convergence protocol (PDCP), and/or radio resource control (RRC) elements. A central processing unit (CPU) of the baseband circuitry 104 may be configured to run elements of the protocol stack for signaling of the PHY, MAC, RLC, PDCP, NAS and/or RRC layers. In some implementations, the baseband circuitry may include one or more audio digital signal processor(s) (DSP). The audio DSP(s) may include elements for compression/decompression and echo cancellation and may include other suitable processing elements in other implementations. Components of the baseband circuitry may be suitably combined in a single chip, a single chipset, or disposed on a same circuit board in some implementations. In some implementations, some or all of the constituent components of the baseband circuitry 104 and the application circuitry 102 may be implemented together such as, for example, on a system on a chip (SoC).

In some implementations, the baseband circuitry 104 may provide for communication compatible with one or more radio technologies. For example, in some implementations, the baseband circuitry 104 may support communication with an evolved universal terrestrial radio access network (EUTRAN) and/or other wireless metropolitan area networks (WMAN), a wireless local area network (WLAN), a wireless personal area network (WPAN). Implementations in which the baseband circuitry 104 is configured to support radio communications of more than one wireless protocol may be referred to as multi-mode baseband circuitry.

RF circuitry 106 may enable communication with wireless networks using modulated electromagnetic radiation through a non-solid medium. In various implementations, the RF circuitry 106 may include switches, filters, amplifiers, etc. to facilitate the communication with the wireless network. RF circuitry 106 may include a receive signal path which may include circuitry to down-convert RF signals received from the front end circuitry 108 and provide baseband signals to the baseband circuitry 104. RF circuitry 106 may also include a transmit signal path which may include circuitry to up-convert baseband signals provided by the baseband circuitry 104 and provide RF output signals to the front end circuitry 108 for transmission. Example implementations of RF circuitry 106 are described further below with reference to FIG. 2.

Front end circuitry 108 may include a receive signal path which may include circuitry configured to operate on RF signals received from one or more antennas 110, amplify the received signals and provide the amplified versions of the received signals to the RF circuitry 106 for further processing. Front end circuitry 108 may also include a transmit signal path which may include circuitry configured to amplify signals for transmission provided by the RF circuitry 106 for transmission by one or more of the one or more antennas 110.

In some implementations, the front end circuitry 108 may include a TX/RX switch to switch between transmit mode and receive mode operation. The front end circuitry 108 may include a receive signal path and a transmit signal path. The receive signal path of the front end circuitry 108 may include a low-noise amplifier (LNA) to amplify received RF signals and provide the amplified received RF signals as an output (e.g., to the RF circuitry 106). The transmit signal path of the front end circuitry 108 may include a power amplifier (PA) to amplify input RF signals (e.g., provided by RF circuitry 106), and one or more filters to generate RF signals for subsequent transmission (e.g., by one or more of the one or more antennas 110).

In some implementations, the mobile device 100 may include additional elements such as, for example, memory/storage, display, camera, sensor, and/or input/output (I/O) interface.

Figure 2:
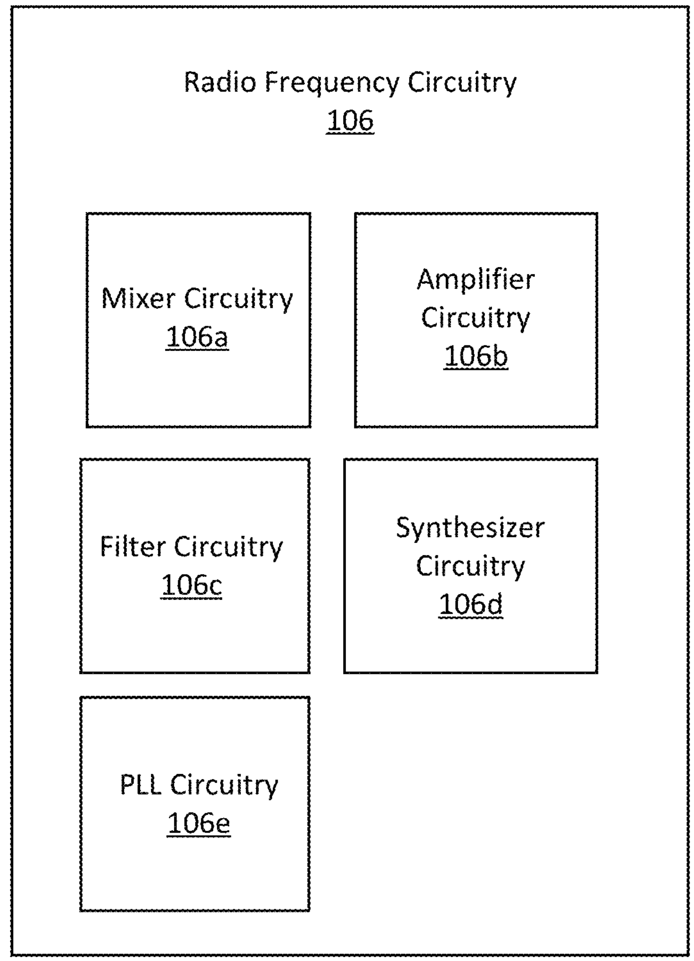
FIG. 2 is a block diagram illustrating components of an electronic device implementing aspects of the disclosure, according to an implementation.

FIG. 2 is a block diagram showing elements of RF circuitry 106 according to an implementation. For example, the RF circuitry 106 may be the same or similar to RF circuitry 106 described with reference to FIG. 1 above. RF circuitry 106 may enable communication with wireless networks using modulated electromagnetic radiation through a non-solid medium. In various implementations, the RF circuitry 106 may include switches, filters, amplifiers, etc. to facilitate the communication with the wireless network. The RF circuitry 106 may also include a phase locked loop for locking onto signals received by the antennas 110. RF circuitry 106 may include a receive signal path which may include circuitry to down-convert RF signals received from the FEM circuitry 108 and provide baseband signals to the baseband circuitry 104. RF circuitry 106 may also include a transmit signal path which may include circuitry to up-convert baseband signals provided by the baseband circuitry 104 and provide RF output signals to the FEM circuitry 108 for transmission.

In some implementations, the RF circuitry 106 may include a receive signal path and a transmit signal path. The receive signal path of the RF circuitry 106 may include mixer circuitry **106*a*, amplifier circuitry 106*b* and filter circuitry 106*c*. The transmit signal path of the RF circuitry 106 may include filter circuitry 106*c* and mixer circuitry 106*a*. RF circuitry 106 may also include synthesizer circuitry 106*d* for synthesizing a frequency for use by the mixer circuitry 106*a* of the receive signal path and the transmit signal path. In some implementations, the mixer circuitry 106*a* of the receive signal path may be configured to down-convert RF signals received from the FEM circuitry 108 based on the synthesized frequency provided by synthesizer circuitry 106*d*. The amplifier circuitry 106*b* may be configured to amplify the down-converted signals and the filter circuitry 106*c* may be a low-pass filter (LPF) or band-pass filter (BPF) configured to remove unwanted signals from the down-converted signals to generate output baseband signals. Output baseband signals may be provided to the baseband circuitry 104 for further processing. In some implementations, the output baseband signals may be zero-frequency baseband signals, although this is not a requirement. In some implementations, mixer circuitry 106*a*** of the receive signal path may comprise passive mixers, although the scope of the implementations is not limited in this respect.

In some implementations, the mixer circuitry **106*a* of the transmit signal path may be configured to up-convert input baseband signals based on the synthesized frequency provided by the synthesizer circuitry 106*d* to generate RF output signals for the FEM circuitry 108. The baseband signals may be provided by the baseband circuitry 104 and may be filtered by filter circuitry 106*c*. The filter circuitry 106*c*** may include a low-pass filter (LPF), although the scope of the implementations is not limited in this respect.

In some implementations, the mixer circuitry **106*a* of the receive signal path and the mixer circuitry 106*a* of the transmit signal path may include two or more mixers and may be arranged for quadrature downconversion and/or upconversion respectively. In some implementations, the mixer circuitry 106*a* of the receive signal path and the mixer circuitry 106*a* of the transmit signal path may include two or more mixers and may be arranged for image rejection (e.g., Hartley image rejection). In some implementations, the mixer circuitry 106*a* of the receive signal path and the mixer circuitry 106*a* may be arranged for direct downconversion and/or direct upconversion, respectively. In some implementations, the mixer circuitry 106*a* of the receive signal path and the mixer circuitry 106*a*** of the transmit signal path may be configured for super-heterodyne operation.

In some implementations, the output baseband signals and the input baseband signals may be analog baseband signals, although the scope of the implementations is not limited in this respect. In some alternate implementations, the output baseband signals and the input baseband signals may be digital baseband signals. In these alternate implementations, the RF circuitry 106 may include analog-to-digital converter (ADC) and digital-to-analog converter (DAC) circuitry and the baseband circuitry 104 may include a digital baseband interface to communicate with the RF circuitry 106. In some dual-mode implementations, a separate radio IC circuitry may be provided for processing signals for each spectrum, although the scope of the implementations is not limited in this respect.

In some implementations, the synthesizer circuitry **106*d* may be a fractional-N synthesizer or a fractional N/N+1 synthesizer, although the scope of the implementations is not limited in this respect as other types of frequency synthesizers may be suitable. For example, synthesizer circuitry 106*d* may be a delta-sigma synthesizer, a frequency multiplier, or a synthesizer comprising a phase-locked loop with a frequency divider. In some implementations the PLL circuitry 106*e* may be provided as separate from synthesizer circuitry 106*d* as shown in FIG. 2. In some implementations more than one PLL is provided in RF circuitry 106**. For example, there may be separate PLLs provided in RF circuitry for a synthesizer and for FM demodulation of received signals.

The synthesizer circuitry **106*d* may be configured to synthesize an output frequency for use by the mixer circuitry 106*a* of the RF circuitry 106 based on a frequency input and a divider control input. In some implementations, the synthesizer circuitry 106*d*** may be a fractional N/N+1 synthesizer.

In some implementations, frequency input may be provided by a digital controlled oscillator (DCO). Divider control input may be provided by either the baseband circuitry 104 or the applications processor 102 depending on the desired output frequency. In some implementations, a divider control input (e.g., N) may be determined from a look-up table based on a channel indicated by the applications processor 102.

Synthesizer circuitry **106*d* of the RF circuitry 106** may include a divider, a PLL, a multiplexer and a phase accumulator. In some implementations, the divider may be a dual modulus divider (DMD) and the phase accumulator may be a digital phase accumulator (DPA). In some implementations, the DMD may be configured to divide the input signal by either N or N+1 (e.g., based on a carry out) to provide a fractional division ratio. In some example implementations, the PLL may include a set of cascaded, tunable, delay elements, a phase detector, a charge pump and a D-type flip-flop. In these implementations, the delay elements may be configured to break a DCO period up into Nd equal packets of phase, where Nd is the number of delay elements in the delay line. In this way, the PLL provides negative feedback to help ensure that the total delay through the delay line is one DCO cycle.

In some implementations, synthesizer circuitry **106*d* may be configured to generate a carrier frequency as the output frequency, while in other implementations, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some implementations, the output frequency may be a LO frequency ($f_{LO}$). In some implementations, the RF circuitry 106** may include an IQ/polar converter.

Figure 3:
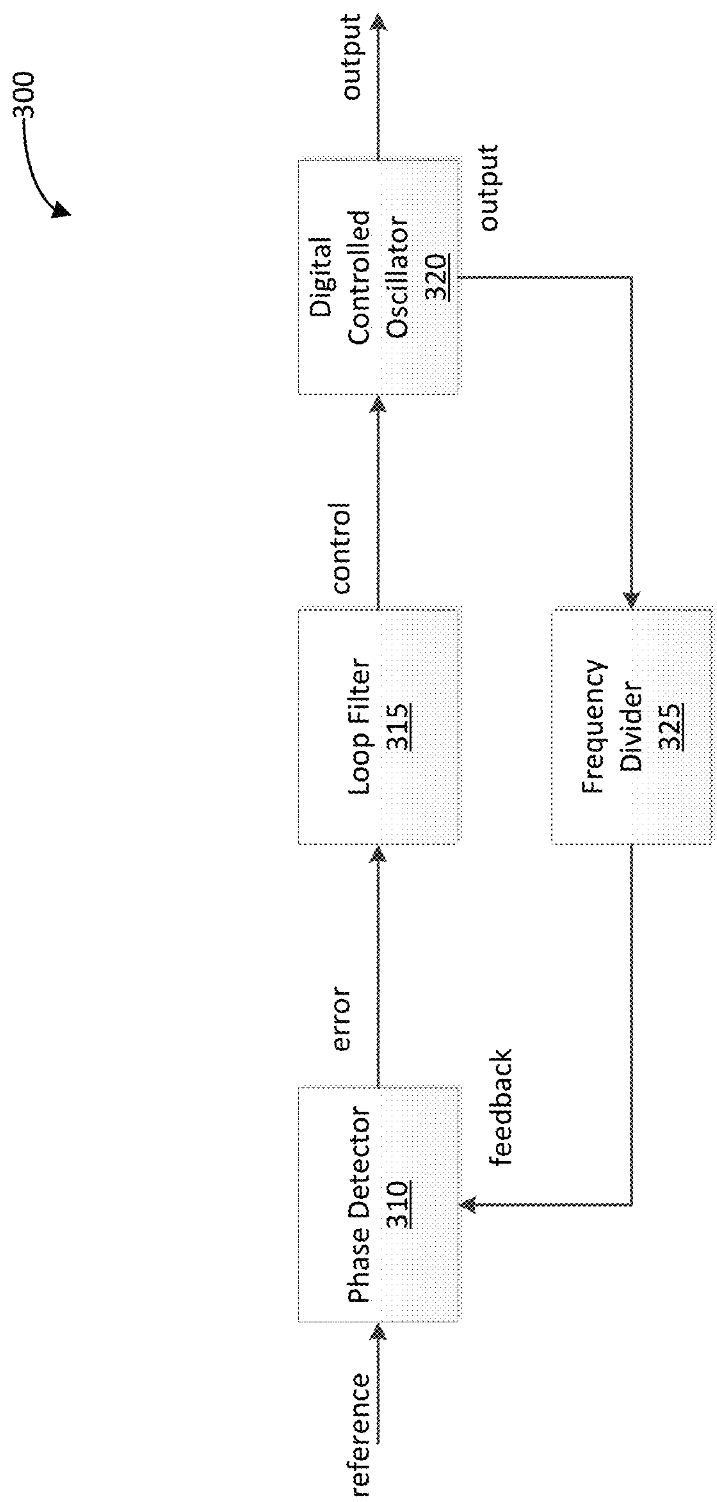
FIG. 3 is a block diagram illustrating components of an electronic device implementing aspects of the disclosure, according to an implementation.

FIG. 3 depicts elements of an example PLL 300 as used in an implementation. In some implementations, additional elements may be used for implementing the PLL 300. For example, the PLL 300 may be the same or similar to the PLL **106*e* shown in FIG. 2 or may be a separate PLL used in synthesizer circuitry 106*d* or other circuitry. In some implementations, the PLL 300 may be part of the mobile device 100 outside of the RF circuitry 106 shown in FIG. 1 or 2**.

The PLL 300 in FIG. 3 may include a phase detector 310, a filter 315, a DCO 320 and a frequency divider 325. The phase detector 310 may determine a difference in the phase from a reference signal and a signal feedback through frequency divider 325 from the DCO 320. For example, the phase detector may provide an error signal that indicates the difference between the phase of the feedback and reference signals. The phase detector 310 may comprise a time to digital converter to convert the phase a counter and phase interpolator to determine a phase difference between the feedback signal and the reference signal. The reference signal may be at a set frequency known to the system. For example, the reference signal may be generated by a clock signal at a known frequency.

The error from the phase detector 310 may be provided to the loop filter 315. The loop filter 315 may provide digital filtering to the error signal to generate a control signal to the DCO 320. For example, the loop filter 315 may use a calculated DCO gain to convert the error signal from the phase detector 310 to a control signal for an FT capacitor bank of the DCO 320. In some implementations, the error signal from the phase detector 310 and the control signal from loop filter 315 may be used only to update the setting of an FT capacitor bank of DCO 320. For example, the CT setting of the DCO may be set when a target frequency for a channel is set for the PLL.

The DCO 320 may then use the control signal to update the output to better match a target frequency. For example, the control signal may indicate an FT setting for the DCO. In some implementations, the signal provided from loop filter 315 may indicate a filtered error from phase detector 310, and the DCO may determine a control signal for setting an FT setting for the DCO 320. In some implementations additional control circuitry uses an error signal from phase detector 310 or loop filter 315 to convert the error signal to a control signal to set an FT setting for the DCO 320.

The DCO 320 may generate an output signal using a set of CT capacitor banks and FT capacitor banks as discussed above. In some implementations, the CT setting for the DCO 320 is set prior to locking of the PLL 300. For example, a processor of the RF circuitry 106 or baseband circuitry 104 as described with reference to FIG. 1 or 2 may provide a signal to set a CT setting for the DCO 320 based on a target frequency. In some implementations, the CT setting may be set using a binary control signal selected by a processor based on CT characterization performed during boot calibration of the apparatus. The FT setting of the DCO 320 may be set during locking of the PLL. For example, the error or control signals may provide a signal indicating a number of FT capacitors in the capacitor bank to use when generating the output signal. In some implementations, the FT setting may be set using a binary or thermometer control signal.

The output of the DCO may be provided as feedback to the phase detector 310 through the frequency divider 325. The frequency divider 325 may be a variable divider that is set to divide the target frequency to the frequency of the reference signal. Therefore, using the frequency divider 325, if the output of the DCO 320 is set to the target frequency, the output of the frequency divider may be at the same frequency as the reference signal. Accordingly the phase detector 310 would register no change in the phase of the signals. The output of the DCO 320 may also be used during boot calibration to determine operational parameters. For example, the output of the DCO 320 may be measured by RF circuitry at one or more CT settings to interpolate a CT characterization curve that may be used to select a CT setting for a target frequency. The output may also be used to measure the DCO gain at a CT setting during boot calibration in order to later calculate in firmware a DCO gain for locking the PLL to a target frequency at another CT.

Figure 4:
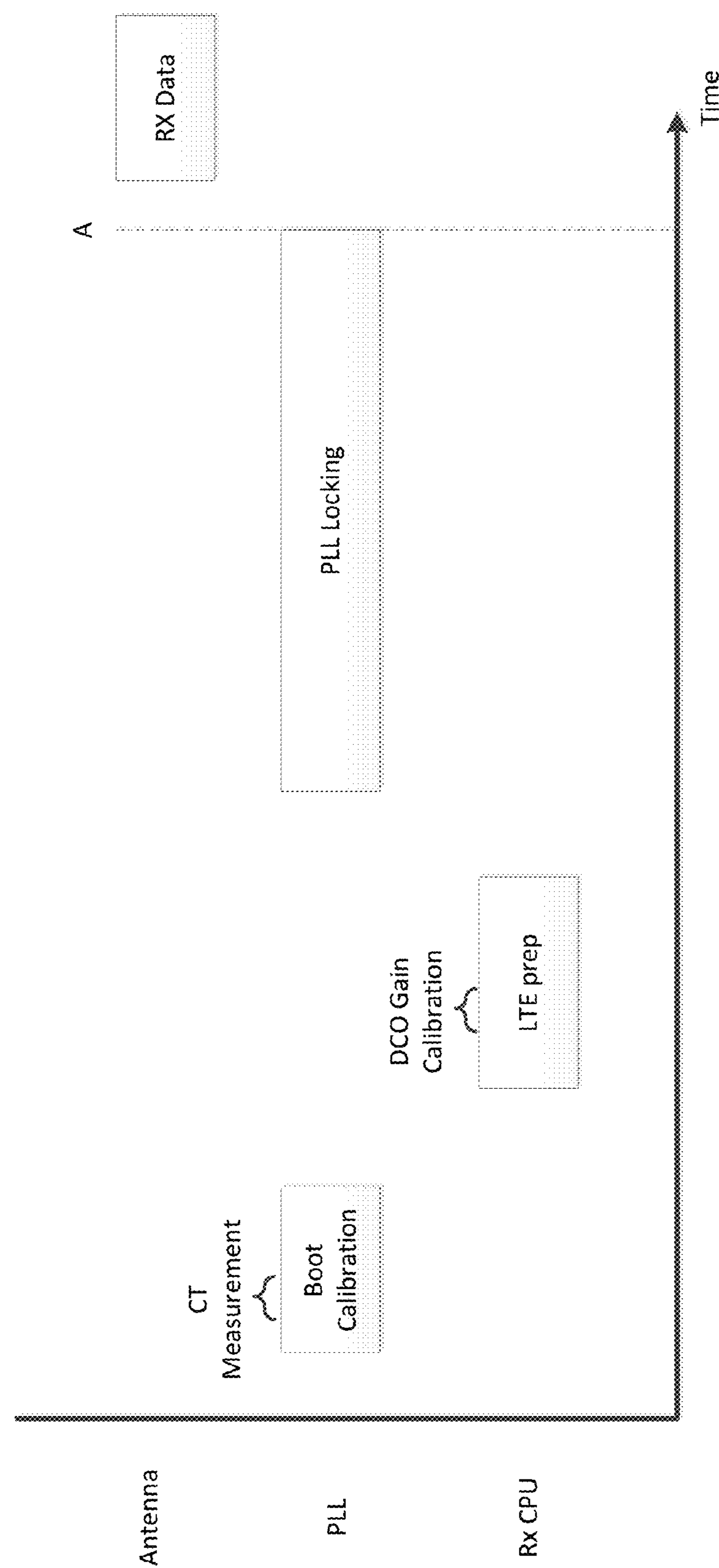
FIG. 4 is a timing diagram illustrating timing of components of an electronic device implementing aspects of the disclosure, according to an implementation.

FIG. 4 is a timing diagram showing operations performed by components of RF circuitry for PLL locking. The timing diagram shows operations performed by a PLL a receiving (Rx) CPU and an antenna. During boot calibration of the RF circuitry, the PLL may measure operation parameters of a DCO for use when locking to a target frequency to receive signals. The PLL may be set to one or more CT settings and one or more FT settings to generate a CT characterization curve and to measure a DCO gain at one CT setting for use to calculate DCO gain at other settings during PLL locking. Additional details of an example method for measuring a DCO gain for a CT setting are discussed below with reference to FIG. 5.

The Rx CPU may be part of RF circuitry for a receive signal path. The Rx CPU may control one or more components of RF circuitry such as providing signals or parameters to the PLL for use setting target frequencies, or setting CT settings for the PLL. At some time after boot calibration, the Rx CPU may initiate an LTE prep macro in response to a signal from baseband circuitry to monitor for data at a particular frequency on an associated antenna. The LTE prep macro may perform instructions to prepare components of RF circuitry to receive an expected signal. For example, the LTE prep macro may set a CT setting for the DCO based on a target frequency. The LTE prep macro may also calculate a DCO gain for a selected CT setting. For example, the DCO gain may be calculated as discussed above and with reference to the example method described in reference to FIG. 6 below.

With the DCO gain calibration completed during the LTE prep macro, the PLL locking process by the PLL may be performed without additional measurements of output frequencies for different FT settings. This may reduce the time taken for PLL locking. Increasing the time for PLL locking may increase time available for other functions to be performed by the RF circuitry. In addition, faster locking may ensure that the PLL is locked before Rx data is received on the antenna after a set time. For example, the dashed line "A" in FIG. 4 may indicate a time by which the PLL must be locked to receive data. Shortened time for PLL locking may also reduce the power consumed during the locking procedure and further improve operation of the mobile device.

Figure 5:
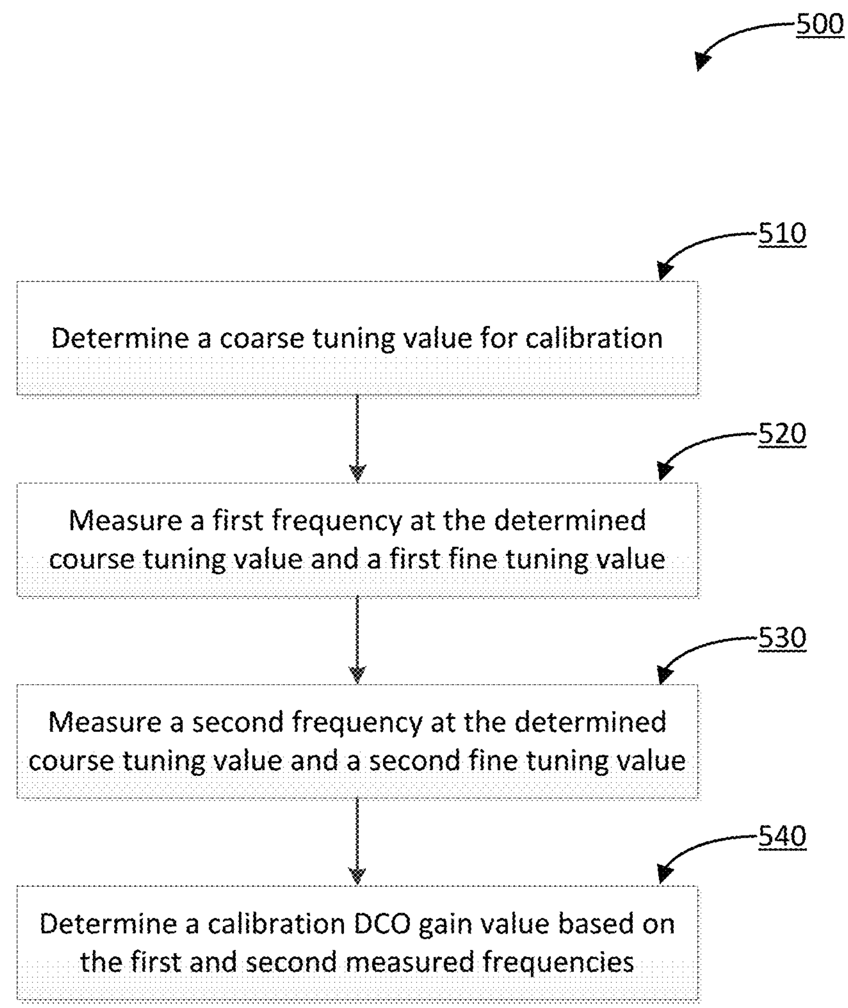
FIG. 5 illustrates a flowchart of an example method of determining calibration parameters for an electronic device, according to an implementation.

FIG. 5 is an example method 500 for measuring DCO gain for a particular CT setting during boot calibration. Beginning in block 510, a processor of the mobile device may determine a CT setting for calibration during boot calibration of RF circuitry. In some implementations, the CT value for calibration may be a preset value used by the RF circuitry for calibration. For example, a memory device that is part of or accessible to the RF circuitry may store a CT value for use during boot calibration. In some implementations, the preset CT value may be a maximum value or minimum value. In some implementations, the preset CT value may be an average, middle, or median CT value. In some implementations, the RF circuitry may select the CT value randomly from a range of available CT values.

In block 520, the RF circuitry may measure a first frequency output from a DCO at the determined CT setting and a first FT setting. For example, the first FT setting may be a minimum setting with FT=0. The frequency at FT=0 may be the same as for the CT on its own. For example, FIG. 7 is a graph 700 depicting the frequency ($f_{DCO}$) output from the DCO for a particular CT value as the FT setting is changed from a minimum to a maximum value. Point 710 shows the frequency of the DCO output at a setting FT=0 for the given CT setting. In some implementations, the value of the first FT setting may be different that FT=0. For example, the first FT setting measured may be at any available FT setting.

In block 530, the RF circuitry may measure a second frequency output from a DCO at the determined CT setting and a second FT setting. For example, the second FT setting may be a maximum setting with FT=max. For example, in FIG. 7, the second FT setting may be at point 720. In some implementations, the value of the first FT setting may be different that FT=0. For example, the first FT setting measured may be at any available FT setting other than the first measured FT setting.

In block 540, the RF circuitry may determine a gain calibration value based on the first and second measured frequencies. For example, as described above, the gain calibration at the determined CT value may be equal to $K_{DCO}=\Delta f_{DCO}/\Delta FT$. As shown in FIG. 7, ΔFT is the difference in the values of the first FT value at point 710 and the second FT value at point 720. For example, in some implementations, the value of ΔFT may be given by $\Delta FT=FT_{max}-FT_0$. The value of $\Delta f_{DCO}$ may be given by the difference of the first measured frequency and the second measured frequency. Thus, for a calibration CT setting, the DCO gain may be calculated. The calculated value may be used by the RF circuitry to calculate a DCO gain for a particular CT value for PLL locking.

Figure 6:
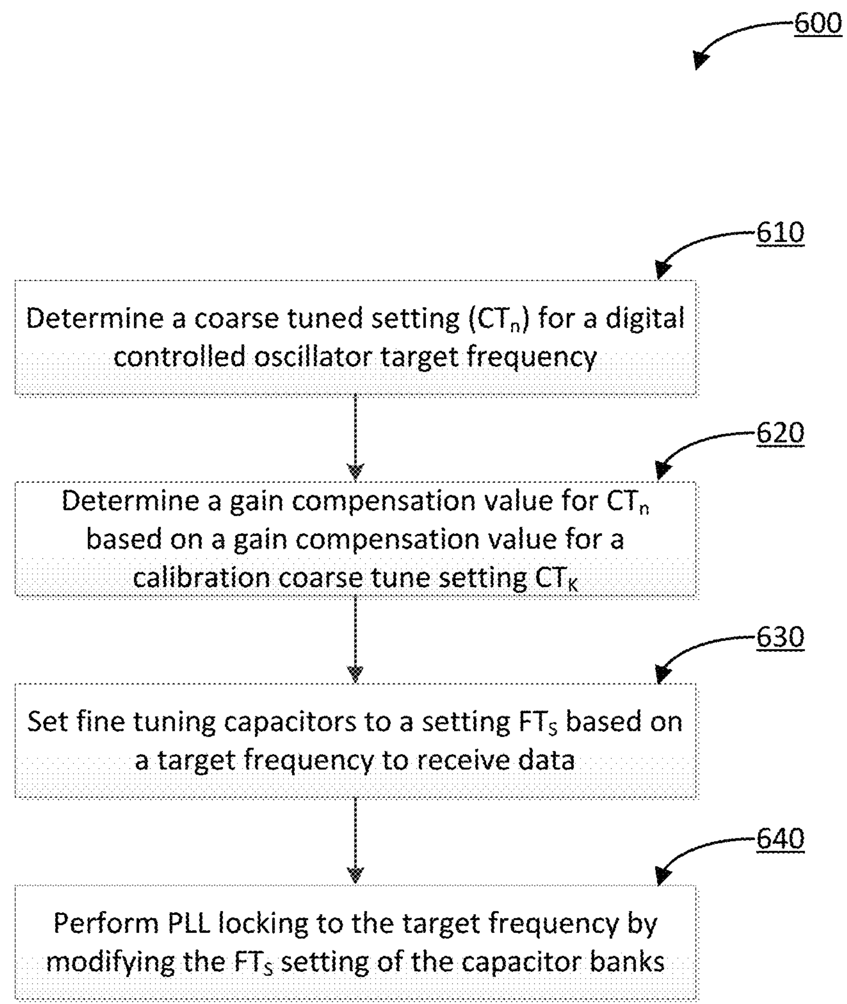
FIG. 6 illustrates a flowchart of an example method of determining calibration parameters for an electronic device, according to an implementation.

FIG. 6 is an example method for calculating DCO gain for a particular CT setting prior to PLL locking. In some implementations, the example method depicted in FIG. 6 may be performed by firmware in an Rx CPU of RF circuitry as described with reference to FIG. 4 above. Beginning in block 610, the RF circuitry determines a CT setting ($CT_n$) for a DCO frequency. For example, the CT setting may be determined based on a CT characterization curve generated during boot calibration of the RF circuitry. In some implementations, the CT setting may be determined in response to receiving an indication that data is to be received from an associated network. For example, if downlink data is scheduled from a network, baseband circuitry may determine that a frequency on which to receive the data. The frequency may then be provided to RF circuitry with an indication to prepare to receive data from an antenna. The processes in the example method of FIG. 6 may then be performed to lock a PLL before the reception of data. In some implementations, the processes in FIG. 6 may be performed similarly for other operations, such as in response to an indication of data to transmit to the network.

In block 620, the RF circuitry determines a gain compensation value for $CT_n$ based on a gain compensation value for a calibration CT setting ($CT_K$). For example, an Rx CPU of the RF circuitry may perform firmware calculations according to equation (3) as discussed above. For example, the firmware may use a previously measured DCO gain $K_{DCO}(CT_K)$ and $f_{DCO}(C_K)$, and a value for $f_{DCO}(C_n)$ calculated based on the CT characterization curve, to generate a DCO gain $K_{DCO}(CT_n)$ for the selected CT value $CT_n$.

In block 630, the RF frequency may set fine tuning capacitors to a setting $FT_S$ based on the target frequency. For example, the FT capacitor bank may be set to an initial setting other than FT=0 that is estimated to be close to the target frequency. For example, the value may be set based on the DCO gain for the selected CT setting.

In block 640, the RF circuitry performs PLL locking to the target frequency by modifying the FT setting of the capacitor banks. For example, the PLL may adjust the setting of the FT capacitors based on error indications from a phase detector. The amount of change to FT settings based on the error signal may be adjusted according to the calculated DCO gain compensation for the particular CT value. For example, an error signal may indicate a frequency error between the phase of the reference signal and output signal. The frequency error may then be used to determine a change to the FT setting using the DCO gain. For example, multiplying the error signal by $1/K_{DCO}$ provides a change in FT settings to reduce the phase error. The PLL locking may repeat the process of compensating an error signal based on the DCO gain until the PLL is locked.

Figure 8:
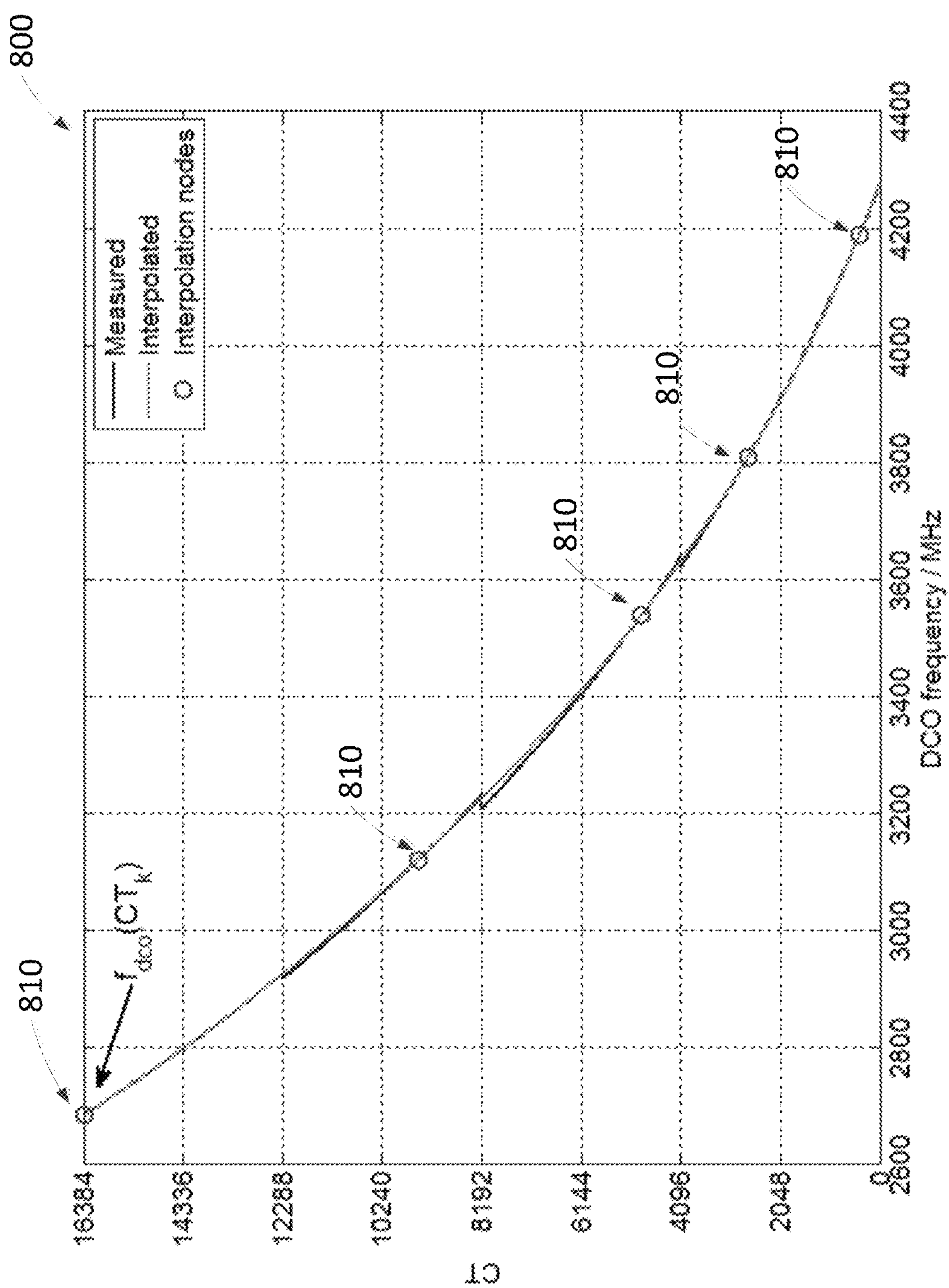
FIG. 8 depicts a graph illustrating measured frequencies for a set of course tuning settings compared to interpolated frequencies for a set of course tuning settings, according to an implementation.
Figure 9A:
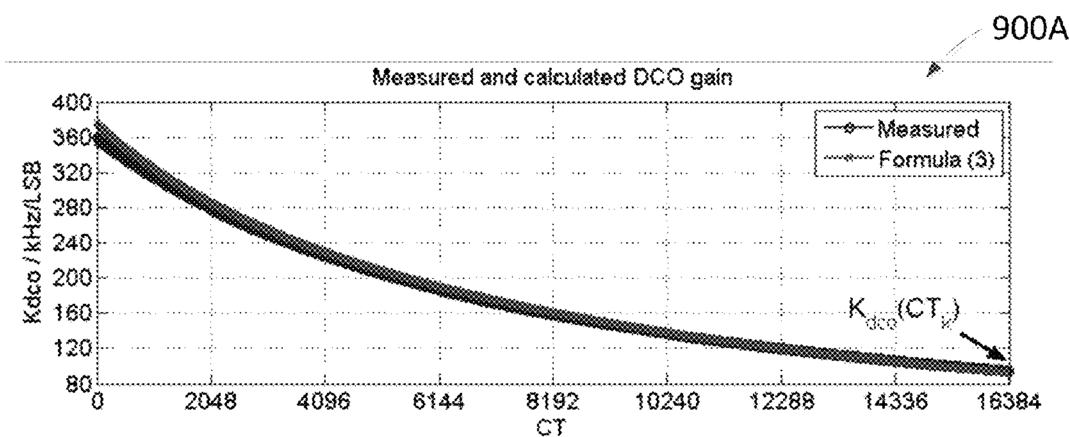
FIG. 9A depicts a graph illustrating measured and calculated digitally controlled oscillator gains for course tuning settings, according to an implementation.
Figure 9B:
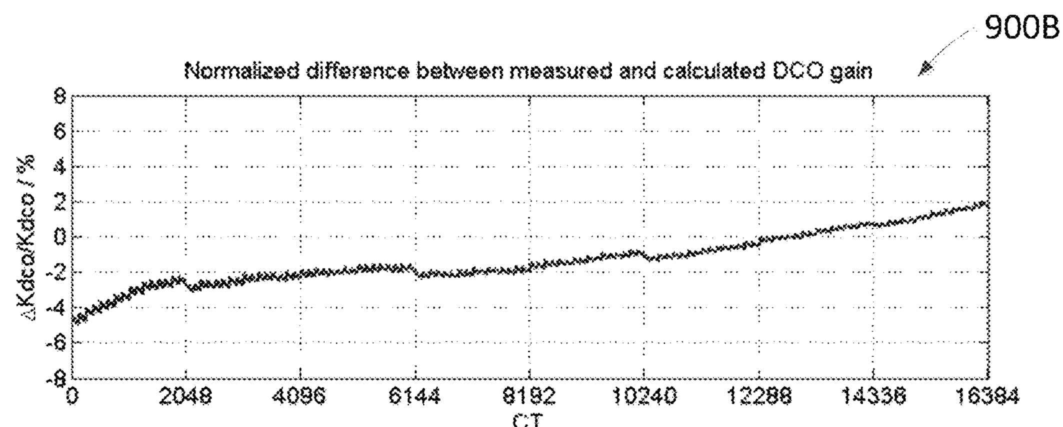
FIG. 9B depicts a graph illustrating measured and calculated digitally controlled oscillator gains for course tuning settings, according to an implementation.

FIG. 8 and FIGS. 9A and 9B are graphs showing a comparison of measured values for frequencies output by a DCO with calculated or interpolated values. These graphs provide an example of one implementation of a PLL, and results of a particular set of parameters. In various implementations, the results may be different. For example, different implementations may have a different number of CT or FT values or ranges, may operate at a different range of frequencies, may perform different operations for measuring, interpolating, or calculating values, or may have other differences that may affect the results. Accordingly, the data shown in FIG. 8 and FIGS. 9A and 9B are given as an example only.

FIG. 8 is a graph 800 depicting measured frequencies for a set of CT settings compared to interpolated frequencies for a set of CT settings. In the graph, the solid curved line depicts interpolated frequencies, and the broken line depicts measured frequencies. As shown in the example graph, the frequencies may be in the range of 2600-4400 MHz. The CT states for the CT capacitor bank may vary from state CT=0 to state CT=16383. This enables $2^{14}$ CT states to be encoded for the CT capacitor bank with a 14 digit binary number. The solid curve line may be generated by interpolated a curve at a set of interpolation nodes, shown as circles 810 on the graph. The frequency at the CT value for each of the interpolation nodes may be measured by the system to generate a CT characterization curve that correlates DCO frequency to a particular CT setting. As discussed above, this characterization may be used to determine a particular CT value to use for a target frequency. The CT setting may then be used to determine a DCO gain for the FT capacitor bank.

FIGS. 9A and 9B are graphs depicting the measured and calculated DCO gains for particular CT settings. FIG. 9A is a graph 900A showing CT settings on the horizontal axis and the DCO gain on the vertical axis. The solid line indicates the measured gain and the broken line indicates the calculated gain for the CT settings. As shown in FIG. 9A, the gain may vary from approximately 90 kHz per change in the least significant bit in the FT settings to 360 kHz per change in the least significant bit in the FT settings depending on the CT setting. As shown in FIG. 9A, the measured and calculated lines track closely through the available CT settings.

FIG. 9B is a graph 900B showing a measure of the fit between the measured and calculated gains. The vertical axis in FIG. 9B shows a normalized difference between the measured and calculated gain based on the frequency at which the CT setting operates. For example, for a setting of $CT_n$, the value in graph 900B may represent the percentage of difference in the measured gain and the calculated gain for setting $CT_n$ to the measured frequency at the setting $CT_n$. As shown in the graph 900B, the normalized error for the DCO gain is within a range of ±6%. In some implementations this may be well within operational accuracy of parameters for the system. As discussed above, in some implementations, the results may be different and may results in more or less accurate calculations of measured DCO gain.

While the present disclosure describes a number of implementations, those skilled in the art will appreciate numerous modifications and variations therefrom. It is intended that the appended claims cover all such modifications and variations as fall within the true spirit and scope of this present disclosure.

The following examples pertain to further implementations of the disclosure.

Example 1 is an apparatus of a mobile device to calibrate RF circuitry for mobile communications comprising: a phase locked loop (PLL) comprising a digital controlled oscillator (DCO) one or more processors coupled to the PLL, the processors to: determine a coarse tuning setting for the DCO based on a target frequency of a wireless channel; and calculate, a DCO gain value for the coarse tuning setting based on a calibration DCO gain value for a calibration coarse tuning setting.

In example 2, in the apparatus of example 1, the DCO may comprise a coarse tuning capacitor bank and a fine tuning capacitor bank, wherein the coarse tuning capacitor bank is set to a coarse capacitance based on a coarse tuning value provided to the DCO and the fine tuning capacitor bank is set to a fine capacitance during PLL locking using the DCO gain value.

In example 3, in the apparatus of claim 1, the one or more processors are further to generate the calibration DCO gain during a boot calibration of the apparatus.

In example 4, in the apparatus of example 3, to generate the calibration DCO gain the one or more processors are further to: determine the calibration coarse tuning setting; measure a first frequency at the calibration coarse tuning setting for a first fine tuning value; measure a second frequency at the calibration coarse tuning setting for a second fine tuning value; and determine the calibration DCO gain value based at least in part on the first frequency and the second frequency.

In example 5, in the apparatus of example 1, to determine a coarse tuning setting for the DCO based on a frequency of a wireless channel, the processing device is to access a coarse tuning characterization curve to determine a coarse tuning value for the target frequency.

In example 6, the apparatus of example 1 further comprises an antenna to receive or transmit data at the target frequency.

In example 7, in the apparatus of example 1, the one or more processors are to determine the coarse tuning setting and calculate the DCO gain value during operations of a prep macro for a configured radio access technology.

In example 8, in the apparatus of claim 1, to calculate the DCO gain value, the processors are to perform one or more firmware operations.

In example 9, in the apparatus of example 1, the processors are further to provide the calculated DCO gain to a loop filter of the PLL.

In example 10, in the apparatus of claim 1, the one or more processors are to: determine an indication of a temperature of the PLL; and compensate the calculated DCO gain of the PLL based at least in part on an indication of the temperature of the PLL.

Example 11 is an apparatus of a mobile device to calibrate RF circuitry for mobile communications comprising: means for determining a coarse tuning setting for a digital controlled oscillator (DCO) of a digital phase locked loop (PLL) based on a target frequency; and means for calculating a DCO gain value at the coarse tuning setting based on a calibration coarse tuning setting and a calibration DCO gain measured at the calibration coarse tuning setting.

In example 12, the apparatus of example 11, further comprises means for determining the calibration DCO gain.

In example 13, the apparatus of example 11, further comprises means for performing PLL locking to the target frequency using the calculated DCO gain value.

In example 14 apparatus of example 11, further comprising means for measuring the frequency of an output of the DCO.

In example 15, in the apparatus of example 11, the DCO comprises: means for coarse tuning an output frequency of the DCO; and means for fine tuning the output frequency of the DCO.

In example 16, in the apparatus of claim 11, the fine tuning capacitor bank is set to a fine capacitance during PLL locking using the DCO gain value.

Example 17 is a system of a mobile device that calculates a gain value for a phase locked loop comprising: a digital controlled oscillator (DCO) comprising a coarse tuning capacitor bank and a fine tuning capacitor bank; one or more processors coupled to the DCO, the one or more processors to: determine a calibration DCO gain based on a calibration coarse tuning setting; determine a coarse tuning setting for the DCO based on a target frequency; and calculate a DCO gain at the coarse tuning setting for the DCO.

In example 18, the system of claim 17, further comprises an antenna to receive or transmit wireless signals at the target frequency.

In example 19, the system of claim 17, further comprises baseband circuitry coupled to the one or more processors, the baseband circuitry to: determine the target frequency based on messages received from a mobile network; and provide the target frequency to the processor.

In example 20, in the system of claim 17, the one or more processors are to determine the coarse tuning setting for the DCO and calculate the DCO gain in response to receiving an indication that data is to be received from a network.

In example 21, in the system of claim 17, to determine the calibration DCO gain, the one or more processors are to: measure a first frequency of the DCO output at a first fine tuning setting and the calibration coarse tuning setting; measure a second frequency of the DCO output at a second fine tuning setting and the calibration coarse tuning setting; and calculate the calibration DCO gain based on the measured first frequency and second frequency.

Example 22 is a method comprising: determining a coarse tuning setting for a digital controlled oscillator (DCO) of a digital phase locked loop (PLL) based on a target frequency; and calculating a DCO gain value at the coarse tuning setting based on a calibration coarse tuning setting and a calibration DCO gain measured at the calibration coarse tuning setting.

In example 23, the method of example 22 further comprises setting a coarse tuning capacitance bank of the DCO to a course tuning capacitance based on a coarse tuning value provided to the DCO; and setting a fine tuning capacitor bank of the DCO to a fine capacitance during PLL locking using the DCO gain value.

In example 24, the method of example 22 further comprises generating the calibration DCO gain during boot calibration of the apparatus.

In example 25, in the method of example 24, generating the calibration DCO gain further comprising: determining the calibration coarse tuning setting; measuring a first frequency at the calibration coarse tuning setting for a first fine tuning value; measuring a second frequency at the calibration coarse tuning setting for a second fine tuning value; and determining the calibration DCO gain value based at least in part on the first frequency and the second frequency.

In example 26, in the method of example 22, determining a coarse tuning setting for the DCO based on the frequency of the wireless channel comprises accessing a coarse tuning characterization curve to determine a coarse tuning value for the target frequency.

In example 27, the method of example 22 further comprises transmitting, by an antenna, data at the target frequency.

In example 28, in the method of example 22, determining the coarse tuning setting and calculating the DCO gain value are performed during operations of a prep macro for a configured radio access technology.

In example 29, the method of example 22 further comprises providing the calculated DCO gain to a loop filter of the PLL.

In example 30, the method of example 22 further comprises: determining an indication of a temperature of the PLL; and compensating the calculated DCO gain of the PLL based at least in part on an indication of the temperature of the PLL.

Example 31 is an apparatus comprising means to perform a method as claimed in any of claims 22 to 30.

Example 32 is a machine-readable storage including machine-instructions that, when executed, cause an apparatus to perform a method as claimed in any of claims 22 to 30.

In the description herein, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present disclosure. It will be apparent, however, that these specific details need not be employed to practice the present disclosure. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system have not been described in detail in order to avoid unnecessarily obscuring the present disclosure.

Instructions used to program logic to perform implementations of the disclosure can be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one implementation, refers to the hardware, which is specifically configured to recognize and/or execute the code to be held on a non-transitory medium. Furthermore, in another implementation, use of a module refers to the non-transitory medium including the code, which is specifically adapted to be executed by the microcontroller to perform predetermined operations. And as can be inferred, in yet another implementation, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one implementation, use of the term logic includes hardware, such as transistors, registers, or other hardware, such as programmable logic devices.

Use of the phrase 'configured to,' in one implementation, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focuses on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one implementation, refers to some apparatus, logic, hardware, and/or element designed in such a way to enable use of the apparatus, logic, hardware, and/or element in a specified manner. Note as above that use of to, capable to, or operable to, in one implementation, refers to the latent state of an apparatus, logic, hardware, and/or element, where the apparatus, logic, hardware, and/or element is not operating but is designed in such a manner to enable use of an apparatus in a specified manner.

The implementations of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform implementations of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer)

Reference throughout this specification to "one implementation" or "an implementation" means that a particular feature, structure, or characteristic described in connection with the implementation is included in at least one implementation of the present disclosure. Thus, the appearances of the phrases "in one implementation" or "in an implementation" on "in some implementations" in various places throughout this specification are not necessarily all referring to the same implementation. Furthermore, the particular features, structures, or characteristics may be combined in any suitable manner in one or more implementations.

In the foregoing specification, a detailed description has been given with reference to specific exemplary implementations. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of implementation and other exemplarily language does not necessarily refer to the same implementation or the same example, but may refer to different and distinct implementations, as well as potentially the same implementation.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like. The blocks described herein can be hardware, software, firmware or a combination thereof.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "selecting," "receiving," "determining," "generating," "measuring," "calculating," "setting," "identifying," "executing," "transmitting," "communicating," "accessing," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" or "an implementation" or "one implementation" throughout is not intended to mean the same implementation or implementation unless described as such. Also, the terms "first," "second," "third," "fourth," etc. as used herein are meant as labels to distinguish among different elements and may not necessarily have an ordinal meaning according to their numerical designation.

What is claimed is:

1. An apparatus of a mobile device to calibrate radio frequency (RF) circuitry for mobile communications comprising:
- a phase locked loop (PLL) comprising a digital controlled oscillator (DCO); and
- one or more processors coupled to the PLL, the one or more processors to:
  - determine a coarse tuning setting for the DCO based on a target frequency of a wireless channel; and
  - calculate a DCO gain value for the coarse tuning setting based on a calibration DCO gain value for a calibration coarse tuning setting.

2. The apparatus of claim 1, wherein the DCO comprises a coarse tuning capacitor bank and a fine tuning capacitor bank, wherein the coarse tuning capacitor bank is set to a coarse capacitance based on a coarse tuning value provided to the DCO and the fine tuning capacitor bank is set to a fine capacitance during PLL locking using the DCO gain value.

3. The apparatus of claim 1, wherein the one or more processors are further to generate the calibration DCO gain during a boot calibration of the apparatus.

4. The apparatus of claim 3, wherein to generate the calibration DCO gain the one or more processors are further to:
- determine the calibration coarse tuning setting;
- measure a first frequency at the calibration coarse tuning setting for a first fine tuning value;
- measure a second frequency at the calibration coarse tuning setting for a second fine tuning value; and
- determine the calibration DCO gain value based at least in part on the first frequency and the second frequency.

5. The apparatus of claim 1, wherein to determine a coarse tuning setting for the DCO based on the target frequency of the wireless channel, the one or more processors are to access a coarse tuning characterization curve to determine a coarse tuning value for the target frequency.

6. The apparatus of claim 1, further comprising an antenna to receive or transmit data at the target frequency.

7. The apparatus of claim 1, wherein the one or more processors are to determine the coarse tuning setting and calculate the DCO gain value during operations of a prep macro for a configured radio access technology.

8. The apparatus of claim 1, wherein to calculate the DCO gain value, the one or more processors are to perform one or more firmware operations.

9. The apparatus of claim 1, wherein the one or more processors are further to provide the calculated DCO gain to a loop filter of the PLL.

10. The apparatus of claim 1, wherein the one or more processors are to:
- determine an indication of a temperature of the PLL; and
- compensate the calculated DCO gain of the PLL based at least in part on an indication of the temperature of the PLL.

11. An apparatus of a mobile device to calibrate radio frequency (RF) circuitry for mobile communications comprising:
- means for determining a coarse tuning setting for a digital controlled oscillator (DCO) of a digital phase locked loop (PLL) based on a target frequency; and
- means for calculating a DCO gain value at the coarse tuning setting based on a calibration coarse tuning setting and a calibration DCO gain measured at the calibration coarse tuning setting.

12. The apparatus of claim 11, further comprising means for determining the calibration DCO gain.

13. The apparatus of claim 11, further comprising means for performing PLL locking to the target frequency using the calculated DCO gain value.

14. The apparatus of claim 11, further comprising means for measuring the frequency of an output of the DCO.

15. The apparatus of claim 11, wherein the DCO comprises:
- means for coarse tuning an output frequency of the DCO; and
- means for fine tuning the output frequency of the DCO.

16. The apparatus of claim 15, wherein the means for fine tuning the output frequency is set to a fine capacitance of a fine tuning capacitor bankd during PLL locking using the DCO gain value.

17. A system of a mobile device that calculates a gain value for a phase locked loop comprising:
- a digital controlled oscillator (DCO) comprising a coarse tuning capacitor bank and a fine tuning capacitor bank;
- one or more processors coupled to the DCO, the one or more processors to:
  - determine a calibration DCO gain based on a calibration coarse tuning setting;
  - determine a coarse tuning setting for the DCO based on a target frequency; and
  - calculate a DCO gain at the coarse tuning setting for the DCO.

18. The system of claim 17, further comprising an antenna to receive or transmit wireless signals at the target frequency.

19. The system of claim 17, further comprising baseband circuitry coupled to the one or more processors, the baseband circuitry to:
- determine the target frequency based on messages received from a mobile network; and
- provide the target frequency to the one or more processors.

20. The system of claim 17, wherein the one or more processors are to determine the coarse tuning setting for the DCO and calculate the DCO gain in response to receiving an indication that data is to be received from a network.

21. The system of claim 17, wherein to determine the calibration DCO gain, the one or more processors are to:
- measure a first frequency of DCO output at a first fine tuning setting and the calibration coarse tuning setting;
- measure a second frequency of the DCO output at a second fine tuning setting and the calibration coarse tuning setting; and calculate the calibration DCO gain based on the first frequency and second frequency.

* * * * *